United States Patent [19]
Hong et al.

[11] Patent Number: 5,960,288
[45] Date of Patent: Sep. 28, 1999

[54] METHOD OF FABRICATING ELECTROSTATIC DISCHARGE PROTECTION DEVICE

[75] Inventors: Gary Hong, Hsinchu Hsien; Joe Ko, Hsinchu, both of Taiwan

[73] Assignee: United Semiconductor Corp., Taiwan

[21] Appl. No.: 08/997,874

[22] Filed: Dec. 24, 1997

[30] Foreign Application Priority Data

Aug. 12, 1997 [TW] Taiwan .................................. 86111504

[51] Int. Cl.$^6$ .................................................. H01L 21/265
[52] U.S. Cl. ........................... 438/275; 438/281; 438/592
[58] Field of Search ................................. 438/275, 281, 438/592

[56] References Cited

U.S. PATENT DOCUMENTS

| | | |
|---|---|---|
| 5,246,872 | 9/1993 | Mortensen . |
| 5,262,344 | 11/1993 | Mistry . |
| 5,374,565 | 12/1994 | Hsue et al. . |
| 5,416,036 | 5/1995 | Hsue . |
| 5,516,717 | 5/1996 | Hsu . |
| 5,529,941 | 6/1996 | Huang . |
| 5,585,299 | 12/1996 | Hsu . |
| 5,672,527 | 9/1997 | Lee . |
| 5,733,794 | 3/1998 | Gilbert et al. . |

*Primary Examiner*—Richard Booth
*Attorney, Agent, or Firm*—Rabin & Champagne, P.C

[57] ABSTRACT

A method of fabricating an electrostatic protection device, comprises a semiconductor substrate which includes a first type well, a second type well, and a field oxide layer in between. A first gate, a first spacer, and a first source/drain are formed in the first type well. The second type has a second gate, a second spacer, and the second source/drain formed therein. In addition, an oxide layer is distributed on the first gate, the second gate, a part of the first source/drain, and a part of the second source/drain. A silicide layer is formed on the uncovered first source/drain and the uncovered second source/drain. Therefore, the silicide layer and the gate oxide layer are spaced apart.

5 Claims, 2 Drawing Sheets

METHOD OF FABRICATING ELECTROSTATIC DISCHARGE PROTECTION DEVICE

BACKGROUND OF THE INVENTION

1. Field of the Invention

The invention relates in general to a method of fabricating an electrostatic discharge (ESD) protection device, and more particular to a method of fabricating a self-aligned silicide (salicide) ESD protection device.

2. Description of the Related Art

An input signal is applied into the gate of a metal-oxide semiconductor (MOS) in an integrated circuits (IC). However, if the voltage of the input signal is too high, the gate oxide layer breakdowns. It is known that the breakdown voltage of silicon oxide is about $8*10^6$ V/cm. For example, a gate oxide layer has a thickness of about 15 nm, it cannot sustain a voltage more than 12 V. With an applied voltage higher than 12 V, the gate oxide layer breakdowns. Thus, if an integrated circuit with such a gate oxide layer is operated under a voltage of about 5 V, breakdown is not supposed to occur. However, there might be some external input signal with a higher voltage which will endanger the circuit and cause breakdown during operation. This kind of voltage source is normally caused from triboelectricity, that is, the electrostatic charges caused by the friction between objects. When one walks through a room, or takes an IC from a plastic bag, a voltage from hundreds to thousands of volts can be induced. If the high voltage is unintentionally applied to the pins of the IC package, breakdown may occurs, and the device is damaged immediately. Under this condition, the gate oxide cannot be operated normally and a device failure occurs.

To prevent the gate of a MOS component from being damaged, all MOS ICs are provided with certain protection circuits, which are normally applied in devices in very-large semiconductor integrated circuits. The protection circuits are normally arranged between the input/output pads on a chip and a gate of a transistor which is connected thereto.

SUMMARY OF THE INVENTION

It is therefore an object of the invention to provide a method of fabricating an electrostatic discharge protection device of which the gate is kept with a low resistance, and electrostatic discharge protection of the device is improved.

According to the object, a method of fabricating an electrostatic discharge protection device is provided. The method comprises a semiconductor substrate which includes a first type well, a second type well, and a field oxide layer in between. There is a first transistor which comprises a first gate, a first spacer, and a first source/drain in the first type well. The second type well comprises a second transistor which includes a second gate, a second spacer, and the second source/drain. In addition, an oxide layer is distributed on the first gate, the second gate, a part of the first source/drain, and a part of the second source/drain. A suicide layer is formed on the uncovered first source/drain and the uncovered second source/drain.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Referring to FIG. 1 to FIG. 4, in a preferred embodiment according to the invention, the way of forming an electrostatic discharge protection device is presented.

Figure 1:
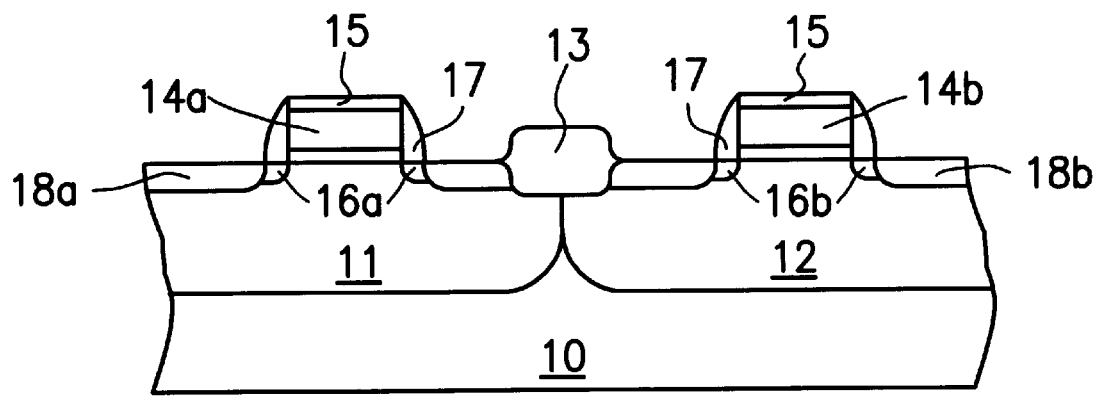
FIG. 1 to FIG. 4 are cross section views of a preferred embodiment according to the invention.

Referring to FIG. 1, a semiconductor substrate 10 is provided. In the semiconductor substrate 10, two lightly doped regions, including a P well 11 and an N well 12 are formed. A field oxide layer 13 is located between N well 12 and P well 11. In the area of the P well 11, a polysilicon layer 14a and a silicon nitride layer 15a are formed sequentially and etched to form a first gate. In the area of the N well, a polysilicon layer 14b and a silicon nitride layer 15 are formed sequentially and etched to form a second gate. An N-type lightly doped region 16a is formed by implanting ion into the P well at the circumference of the polysilicon layer 14a. Similarly, a P-type lightly doped region 16b is formed at the circumference of the polysilicon layer 14b. An insulation layer is formed and etched to form a spacer 17 around the polysilicon layer 14a and polysilicon layer 14b. A first source/drain 18a, for example, an N-type heavily doped region, is formed adjacent to the N-type region 16a at the circumference of the polysilicon layer 14a. A second source/drain 18b, for example, a P-type heavily doped region, is formed adjacent to the P-type region 16b at the circumference of the polysilicon layer 14b.

Figure 2:
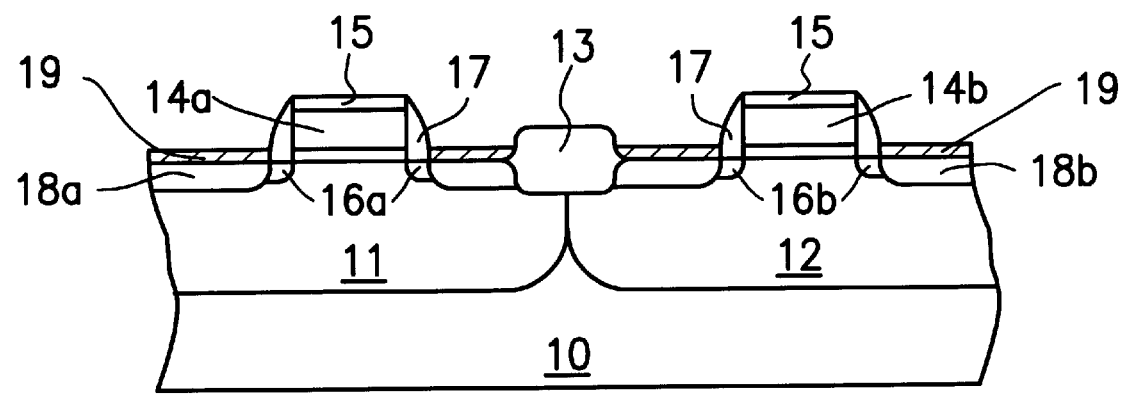

Referring to FIG. 2, an oxidation procedure is performed to form an oxide layer 19 on the first source/drain 18a and the second source/drain 18b. The purpose of the oxide layer 19 is to effectively space a silicide away from a gate oxide layer. Thus, an electrostatic discharge is diverted away from the gate oxide, and the protection is therefore enhanced. The portions of source/drain 18a and 18b covered by the oxide layer can be adjusted as required practically.

Figure 3:
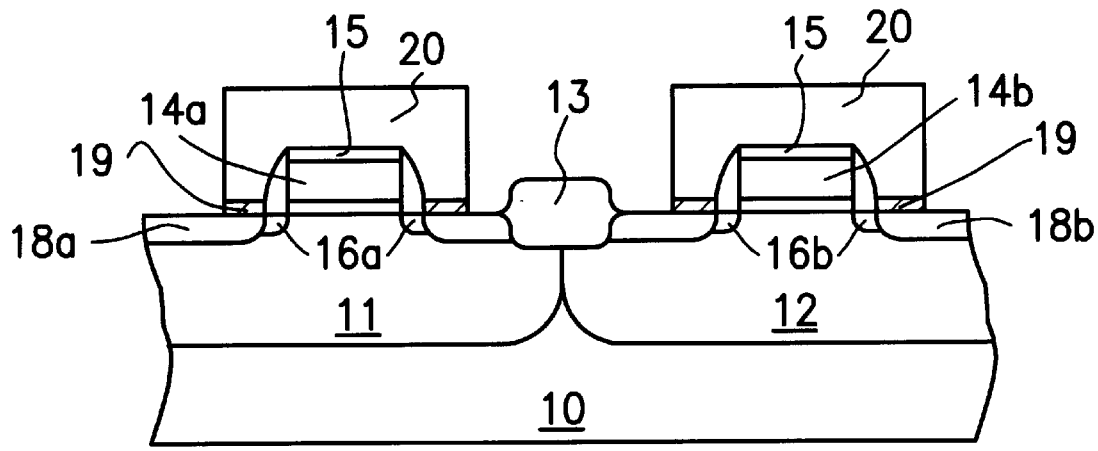

Referring to FIG. 3, a photoresist layer 20 is formed and etched to define a pattern over the semiconductor substrate 10. Using the photoresist layer 20 as a mask, the exposed oxide layer 19 is removed. The photoresist layer 20 is removed thereafter, leaving the oxide layer 19 at the circumference of the polysilicon layer 14a and the polysilicon layer 14b.

Figure 4:
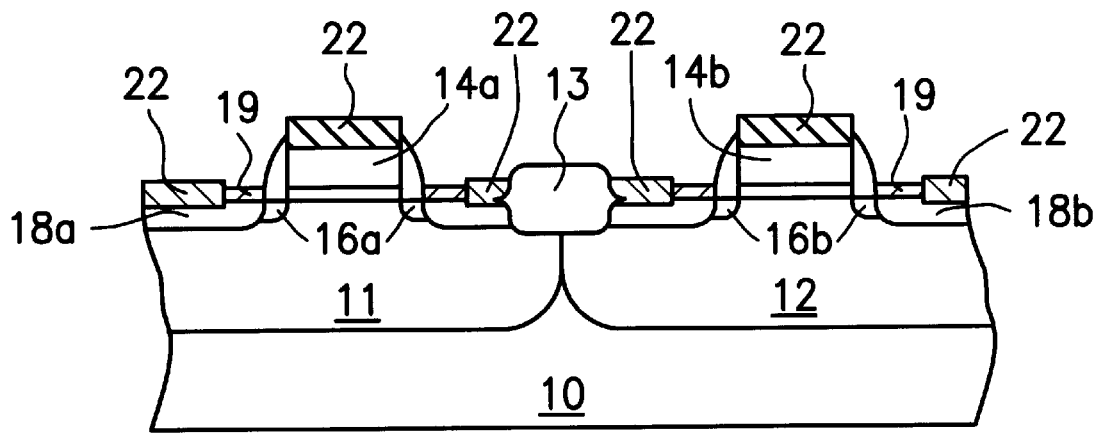

Referring to FIG. 4, the nitride layer 15a, 15b on the polysilicon layer 14a and the polysilicon layer 14b, respectively, is removed. A self-aligned silicide process is performed. A metal layer, such as a titanium layer, is formed over the semiconductor substrate 10. In a thermal process, the titanium layer is reacted with the silicon which is not covered by the oxide layer 10 in the semiconductor substrate 10, and a silicide layer 22, such as a titanium silicide, is formed. The silicide layer 22 is distributed on the polysilicon layer 14a, the polysilicon layer 14b, the uncovered first source/drain 18a and second source/drain 18b. The unreacted metal is then removed.

The advantages of the invention are:

(1) In the electrostatic discharge protection device of the invention, the gate is maintained at a lower resistance. Thus, the device can be operated with a faster response speed.

(2) In the electrostatic discharge protection device of the invention, a higher ESD immunity is obtained because the silicide is spaced away from the gate oxide layer. That is, the high sensitivity to the ESD immunity of the device improves the high ESD protection.

It will be apparent to one skilled in the art that manner of making and using the claimed invention has been adequately disclosed in the above-mentioned description of the preferred embodiments taken together with the drawings.

It will be understood that the above described preferred embodiment of the present invention is susceptible to various modifications, changes, and adaptations, and the same are intended to be comprehended within the meaning and range of equivalents of the appended claims.

What is claimed is:

1. A method of fabricating an electrostatic discharge protection device, comprising:

providing a semiconductor substrate, which includes a first type well, a second type well, and a field oxide layer therebetween;

forming a first gate in the first type well, and a second gate in the second gate in the second type well;

forming a nitride layer on the first gate and the second gate, and a spacer around the first gate and the second gate;

forming a first source/drain around the first gate in the semiconductor substrate;

forming a second source/drain around the second gate in the semiconductor substrate;

performing a thermal step, forming an oxide layer on the first source/drain and the second source/drain;

forming a phtotoresist over the semiconductor substrate, etching and patterning the photoresist, and leaving the photoresist which covers the first gate and the second gate;

removing the exposed oxide layer by using the photoresist as a mask;

removing the photoresist and leaving the oxide layer around the first gate and the second gate;

removing the nitride layer on the first gate and the second gate;

forming a metal layer over the semiconductor substrate; and performing a thermal step, the metal layer reacting with silicon uncovered by the oxide layer, and forming a silicide layer distributed on the first gate, the second gate, the uncovered first source/drain, and the uncovered second source/drain to form said protection device.

2. The method of claim 1, wherein the first type well is a P type well, and the second type well is an N type well.

3. The method of claim 1, wherein further comprises a step of forming a second type lightly doped region around the first gate, and a first type lightly doped region around the second gate in the substrate.

4. The method of claim 1, wherein the oxide layer provides enhanced anti-electrostatic protection in the first source/drain and the second source/drain.

5. The method of claim 1, wherein the silicide layer is a titanium silicide layer.

* * * * *